United States Patent [19]

Considine

[11] Patent Number: 4,800,383
[45] Date of Patent: Jan. 24, 1989

[54] DATA PROCESSING ARRAYS AND A METHOD OF PRODUCING THEM

[75] Inventor: William H. Considine, Sussex, England

[73] Assignee: Stonefield Systems Plc., West Sussex, England

[21] Appl. No.: 781,121

[22] PCT Filed: Jan. 21, 1985

[86] PCT No.: PCT/GB85/00029
  § 371 Date: Nov. 13, 1985
  § 102(e) Date: Nov. 13, 1985

[87] PCT Pub. No.: WO85/03403
  PCT Pub. Date: Aug. 1, 1985

[30] Foreign Application Priority Data

Jan. 21, 1984 [GB] United Kingdom ................ 8401628

[51] Int. Cl.$^4$ .......................... H05K 3/36; G06F 1/00
[52] U.S. Cl. ............................. 340/825.79; 361/413; 361/416; 361/395
[58] Field of Search .................. 340/825.79; 361/395, 361/398, 413, 416; 174/68.5; 29/846; 364/900, 200; 358/10

[56] References Cited

U.S. PATENT DOCUMENTS 4,193,086 3/1980 Kawaguchi ..................... 358/10
4,237,546 12/1980 Wells ........................... 361/413

FOREIGN PATENT DOCUMENTS 0022859 1/1981 European Pat. Off. .

OTHER PUBLICATIONS

I.E.E. Conference Publication No. 14, Institution Of Electrical Engineers Symposium On Applications of Microelectronics, Southampton, 21–23 Sep. 1965 (London, GB) pp. 19/1–19/12, see p. 19/8, line 50–p. 19/9, line 15.

Primary Examiner—Robert L. Griffin
Assistant Examiner—Ralph E. Smith
Attorney, Agent, or Firm—Lucas & Just

[57] ABSTRACT

A notional two-dimensional array of processors is subdivided into a plurality of identical sub-arrays constituted by respective sub-array boards arranged in a stack in which the order of the sub-array boards is determined as if they had been arranged, as the array, in a sheet which is then folded along lines running between the sub-array boards. Interconnections are provided between the sub-array boards as if extended across the fold lines such that none of the interconnections crosses with any other. If the sub-array boards are oriented differently from their orientation as determined by the folding, then measures may be provided for compensating logical direction reversals of the boards.

13 Claims, 4 Drawing Sheets

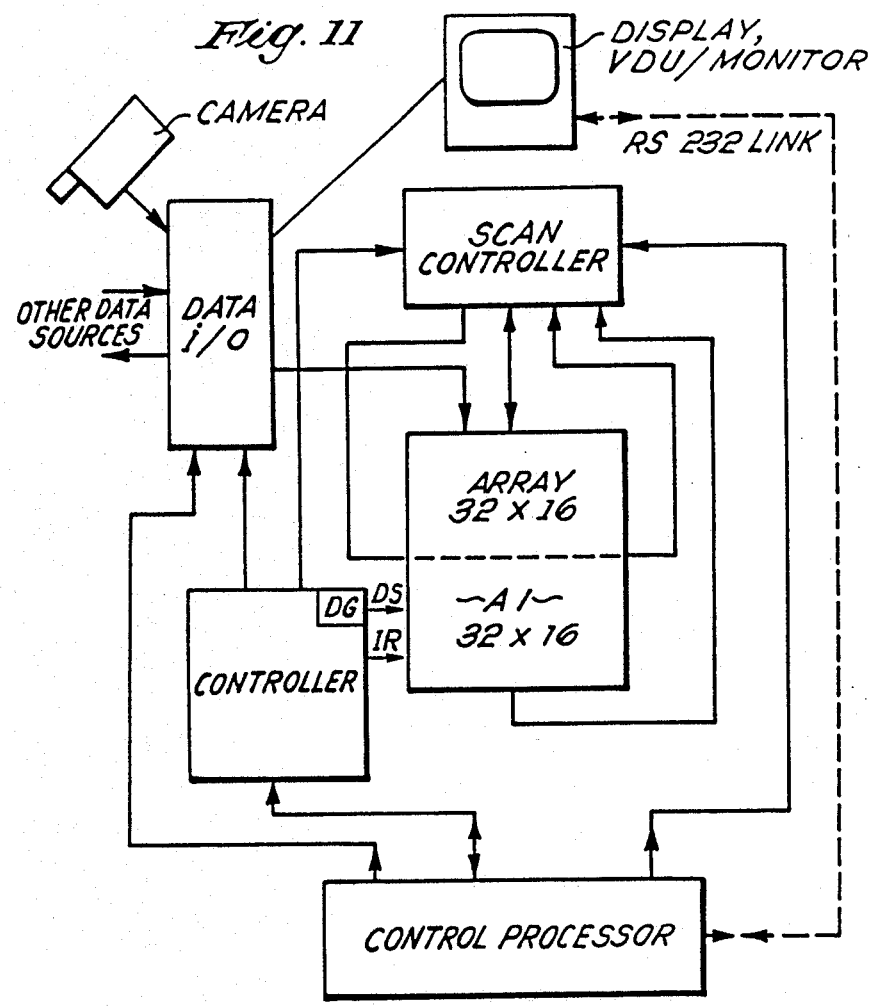
Fig. 11
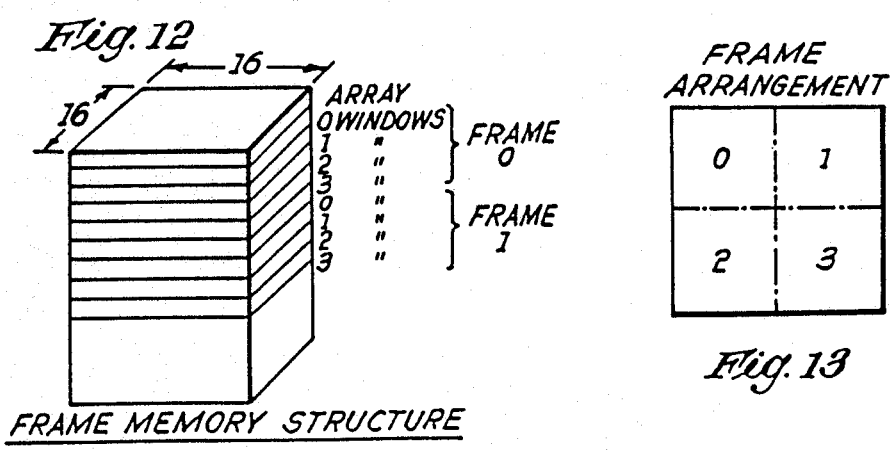
Fig. 12 — FRAME MEMORY STRUCTURE
Fig. 13 — FRAME ARRANGEMENT

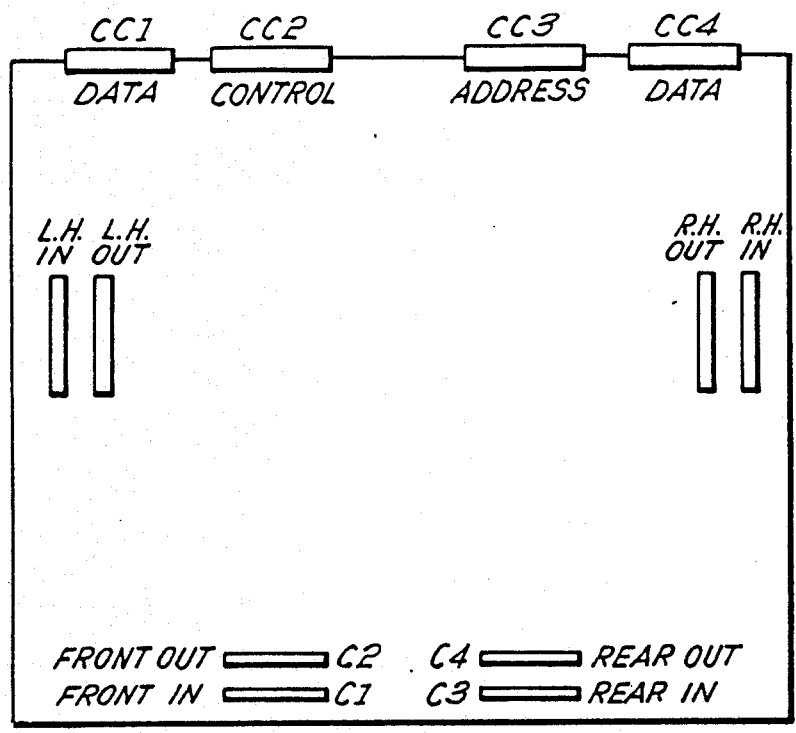
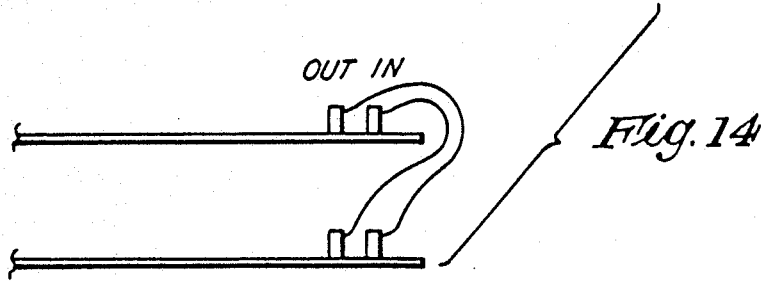
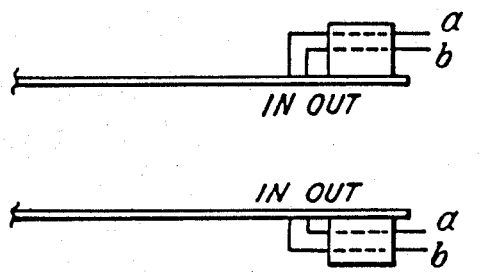
Fig. 14
Fig. 15

DATA PROCESSING ARRAYS AND A METHOD OF PRODUCING THEM

This invention relates to data processor arrays and a method of producing them. In such an array a plurality of data processors are arranged to operate in parallel but also, very often, interacting so that the output data signals of each processor depend on the output data signals of others of the processors.

True array processors can consist of a large number of identical binary processors arranged logically in a two dimensional matrix array in such a way that interconnections can be provided between adjacent processors in the array. Each processor has an input supplied from its 4, 6 or 8 nearest neighbours. In a conventional processor the normal function is for a new piece of information extracted from the processor's memory to be combined in a logical or arithmetic operation with the data which is already held in the register or accumulator of the processor. The elements of an array processor will perform this function but, in addition, of the data to be combined, part may be output from one, or all, or some combination of the nearest neighbour processors.

In order to take full advantage of this type of processing structure it is useful for the array of processors to be as large as possible. To accomplish this a number of processors are assembled as a single integrated circuit, as many processors as possible on each one. These integrated circuits are then assembled on printed circuit boards, the printed circuit preferably being as large as possible to accommodate as many integrated circuits as possible.

Practical arrays, however, may well be of such a size as to involve a number of separate printed circuit boards, and this number may be quite large. For example, each array board may contain between 500 and 2000 processors or more, which means that there may well be several hundred, possibly more than 1000, interconnections between the adjacent boards in the array. This very large number of cnnections makes the array boards difficult to mount and expensive to interconnect, particularly if they are mounted in conventional racks and interconnected in the conventional way by means of a back plane. It should be noted that it is desirable that all array boards should be as nearly identical as possible to facilitate manufacture, maintenance etc.

One method commonly used to overcome situations where there are a number of interconnections is to multiplex these interconnections. This, however, reduces the speed at which such circuits can work. For instance if two signals are to be multiplexed down a single line, then the effective operating speed of the circuit may be halved, and so on. The great virtue of the parallel processor array is that all processors work individually at logic speeds, each complete operation being accomplished in a single clock cycle which may be typically half or quarter of a microsecond. Since any operation may involve communication with adjacent processors, the interconnections between the processors must provide the communicating signals at a speed compatible with that at which the processors operate, otherwise a degradation in the performance of the entire data processing system will be evident. It is, therefore, undesirable to use a multiplexing technique, if the array is to run at its maximum possible speed.

It is an object of the present invention to enable a large number of array boards to be interconnected in a simple manner, while providing fully parallel interconnection paths between the processors in the array. It should be noted that it is desirable to keep these interconnections short, since they carry high speed signals.

According to this invention there is provided a method of producing a data processor array, said method including the steps of notionally arranging, in a two dimensional matrix array, a plurality of sub-array boards each carrying a plurality of data processors comprising a respective sub-array of said matrix array, forming a stack with said sub-array boards in an order determined as if said array comprised a sheet folded along lines between the sub-array boards and providing interconnections between the sub-array boards as if extending across the fold lines such that none of the interconnections crosses with any other said interconnection.

According to a second aspect of this invention there is provided a data processor array comprising a stack of sub-array boards each carrying a plurality of processors comprising a respective sub-array of a notional two-dimensional matrix array of processors, the sub-array boards being arranged in an order in the stack determined as if they had been arranged, as said array, in a sheet which is then folded along lines running between the sub-array boards interconnections between the sub-array boards being arranged as if extending across the fold lines such that none of the interconnections crosses with any other said interconnection.

Preferably the folding is concertina-like in one or both of the two mutually perpendicular directions of the fold lines between the sub-array boards, neighbouring parallel fold lines providing folds in opposite directions.

Conveniently the stack may be vertical with the sub-array boards oriented horizontally. Interconnections may be provided at more than one edge of each sub-array board.

Advantageously, the boards in the stack are oriented identically and means are provided for supplying four sets of directionality control signals to enable the four possible combinations of top-bottom and left-right reversals of the boards.

Embodiments of this invention will now be described, by way of example, with reference to the accompanying drawings in which:

FIG. 11 is a schematic block circuit diagram of an image processing system employing a data processor array embodying this invention;

FIG. 12 is a schematic diagram of part of the array of the system shown in FIG. 11;

FIG. 13 is a schematic diagram of the way in which the screen picture is divided for purposes of image processing by the system shown in FIG. 11;

FIG. 14 is a schematic diagram of the layout on a sub-array board of connectors for interconnections between boards and for common connections to the boards; and;

FIG. 15 is a schematic diagram of a modified arrangement of interconnections between processor chips.

Figure 1:
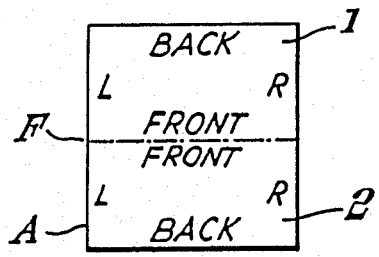
FIGS. 1 and 2 are schematic diagrams illustrating a two-board data processor array unfolded and folded respectively and embodying this invention.
Figure 2:
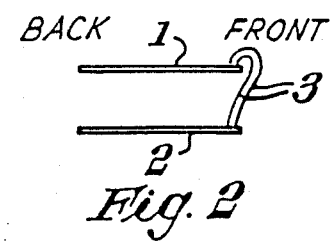
Figure 3:
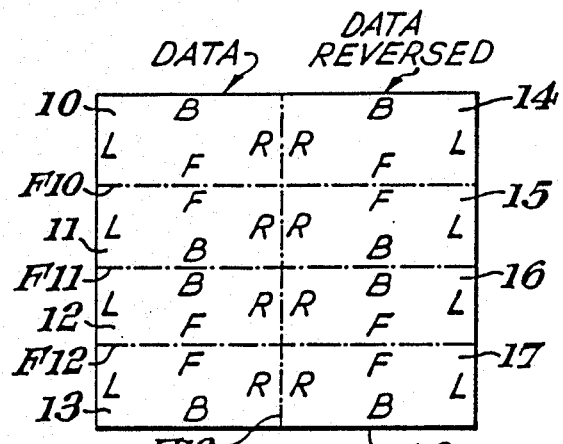
FIGS. 3 to 6 are schematic diagrams of respective steps in the formation of a stack of eight sub-array boards forming a second embodiment of this invention.
Figure 4:
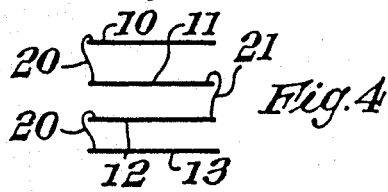

Referring to FIGS. 1 and 2, a two-dimensional matrix array of data processors (FIG. 1) is carried equally on two identical sub-array boards 1 and 2 which are stacked by notionally folding the array A constituted by the boards 1 and 2 along fold line F between the boards. Interconnection between the boards is provided by strip cable 3 interconnecting adjacent edges (via edge connectors) of the sub-arrays provided by the respective boards 1 and 2. Each sub-array comprises a matrix arrangement of $32 \times 16$ digital data processor (not shown in detail) and the complete array comprises a $32 \times 32$ matrix of such processors.

Figure 6:
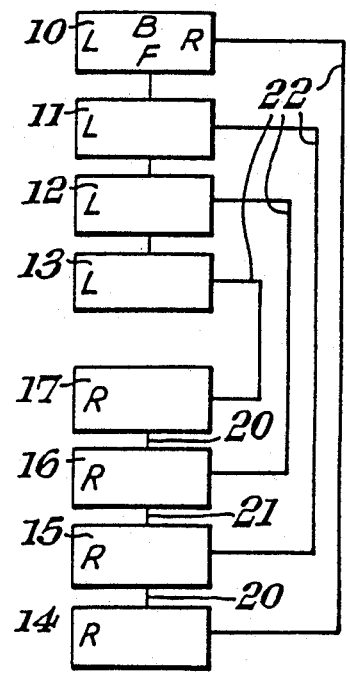
Figure 5:
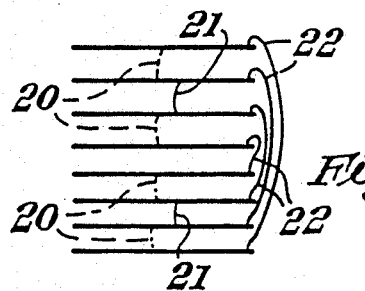
Figure 7:
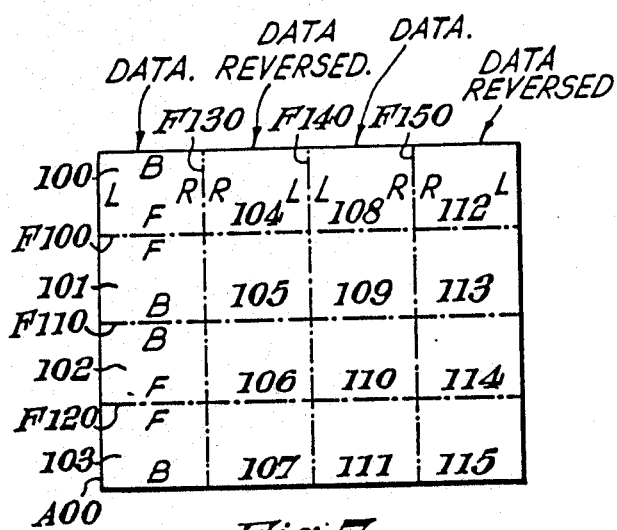
FIGS. 7 to 10 are schematic diagrams of respective steps in the formation of a stack of sixteen sub-array boards forming a third embodiment of this invention.
Figure 8:
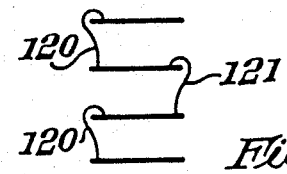
Figure 9:
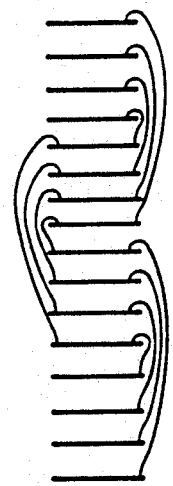

Referring to FIGS. 3 to 6 a $2 \times 4$ matrix arrangement of identical sub-array boards 10 to 17 constitutes an array A0 of $64 \times 64$ digital data processors (each board carries $32 \times 16$ processors). The boards are stacked by notionally folding the array A0 firstly in alternately opposite directions about fold lines F10 to 12 (concertina-like) and then about fold line F13. Interconnections 20,21,22 are provided respectively on three sides of the stack to interconnect the boards by means of strip cables extending normally to the notional fold lines. FIG. 6 is the block circuit diagram of the resulting stack.

Referring to FIGS. 7 to 10, the array A0 has been expanded to become an array A00 of $128 \times 64$ processors carried on $4 \times 4$ identical sub-array boards 100 to 115. As with the array A0, the stack here is formed by notional folding along lines F100 and F120 and then by a similar folding operation about the lines F130 to F150. As a result interconnections 120 to 123 are provided respectively on all four sides of the stack with a strip cable extending normally to the relevant fold lines in each case.

Thus with the embodiments described above stacks of sub-array boards can be mounted in an appropriate rack with associated memories and circuitry and interconnections between the boards can be achieved via all four boards edges if necessary, by means of strip cables none of which crosses with any other of the interconnecting strip cables.

Referring to FIGS. 11 to 13 there is shown one application of the arrays described above, in an image processing system where the screen picture is divided into quarters each of which is processed in turn by means of the processor array A1. If an array four times the size of the array A1 were used then the whole screen picture could be processed at the same time.

For the purposes of digital processing the quarter picture (or picture) is divided into picture elements or pixels each of which provides data to be processed via a respective one of the processors of the array. The pixel dimensions determine the resolution of the processing.

Thus in the embodiments described herein connections between logically adjacent boards will always be on the same side of the resultant stack of boards. What is more, the group of connections between boards will not physically cross those between any other pair of boards. All interconnections may, therefore, be provided by means of strip cables between the four sides of the boards without any of the cables having to cross. If necessary the connections corresponding to one edge of all of the boards may be moved to another edge for physical convenience. It is thus suggested that the boards should be mounted in a conventional type of crate, the back edge of the boards providing all of the common interconnections to the boards such as data, control signals, power supplies etc., and that the interconnections between boards corresponding to the back of the board would then be brought to the front of the board, which would then accommodate two sets of interconnections. This still provides interconnections between the boards which do not cross in any way.

There are a number of ways in which the folding may be accomplished. Since it is also desirable to provide a parallel data path to all of the boards for the transfer of data other than between processors, if the folding is performed as shown in FIGS. 7 to 10, then these data connections would all be along the same physical edge of the boards, which in the case of a crate would be the back edge, and therefore these connections may all be very conveniently wired in parallel to provide a path for the data pattern reversed from left to right, and half will have the pattern reversed from back to front. The latter is merely an addressing problem, and the former can be overcome by providing two data busses, one of which is reversed in the left to right direction. These two busses may then be commoned up at the source of the data, which will probably be a data control printed circuit board in the same crate.

This board arrangement, however, produces one complication. The method of folding the array so far described, results in some of the boards being upside down. When these boards are disconnected, turned correct side up, and reconnected, the interconnecting cables still do not cross, as they have not been substantially disturbed. However, this operation results in the boards so disturbed being logically reversed, although they are now physically in the same orientation. Some will have been reversed in the left-right sense, some in the back-front sense, and some in both senses. If the interconnection between the processors which is required for a particular operation, is the logical left to right direction, then if identical control signals specifying this direction are sent to all of the boards, then half of the boards will be in the logically wrong direction. This means that half of the boards have to be logically reversed in the left to right sense and half have to be logically reversed in the front to back sense. This can be accomplished by generating four different direction control signals and feeding these four different signals to the relevant boards. It may be convenient for all of the four sets of control signals to be fed to all boards and for each board to select the correct one. This selection may then be accomplished electrically, and controlled by an initialisation routine when the system is first powered up, so that the required pattern may be generated by software in a control processor according to the specified arrangement of the sub-array boards. This is desirable because the pattern may be quite complicated if a large number of boards is in use, and the array may not be logically square, rectangular alternatives being possible.

Figure 10:
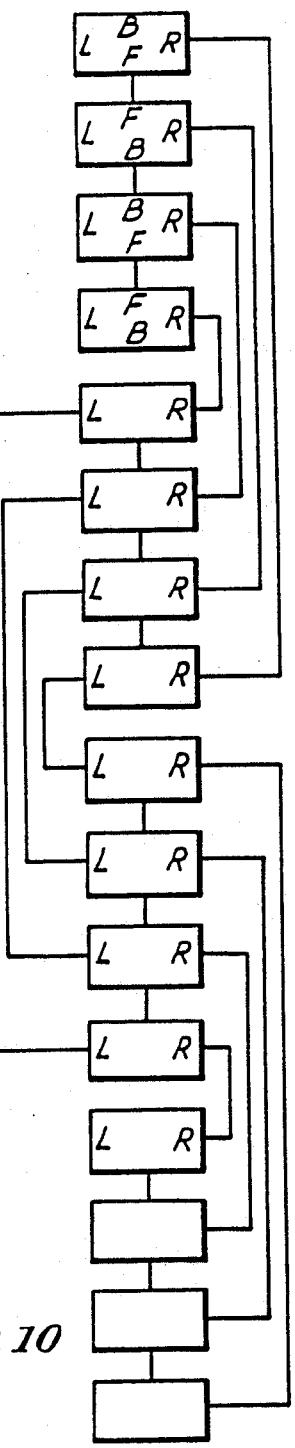

Thus the board interconnections may be provided by connectors Cn as shown in FIG. 14 for each of the boards of the stack shown in FIG. 10. Connectors CCn are provided along the back edge for common connections to the boards provided by data, address and control busses.

In order to simplify the construction of the stack all the sub-array boards are orientated identically so that only the order of the boards from top to bottom in the stack is determined by the notional folding. Clearly such orientation of the boards is possible only because of the logical symmetry of the sub-array about the two axes (for a single column array, symmetry about one such axis is sufficient) respectively normal to adjacent sides of each board. However the boards have to be turned about one of three mutually orthogonal axes through the centre of the board (two of which axes extend perpendicularly to respective sides of the board) to achieve the identity of orientation. Also the particular side-by-side arrangement of array-top and array-bottom connectors C1, C2 and C3, C4 respectively (connections for each array edge are provided via a pair of connectors for respective propagation directions between processors) means that in order to avoid angling or slanting the strip connections (120,121) between adjacent boards of the same column of the array A00, connectors C1,C2 of one board can only be connected to connectors C2,C1 respectively of the next adjacent board. Similarly C3,C4 of one board can only be connected to C4,C3 respectively of the adjacent board. Thus, the array-top (or bottom) of the top board in the stack can only be connected to the array top (or bottom respectively) of the next board down. Since in the two dimensional array A00 each board in a column has its array-top, where connected to a neighbouring board in the column, connected to the array-bottom of that neighbouring board, it is necessary to interchange the array-top and array-bottom of each alternate board in the column i.e. the top-bottom direction of the board is logically reversed.

Similarly when providing the interconnections (122, 123) between boards of the same row, these interconnections will extend between the same sides (left or right) of the relevant boards in order to avoid the connections crossing through the stack. It is therefore necessary for there to be a logical reversal of left-right direction of boards in alternate column-groups (each column-group comprises 4 successive boards of the stack shown in FIG. 10 and constitute the four boards of a particular column of the array A00).

It therefore results that a quarter of the boards in the stack have no logical reversal, a quarter have a left-right reversal only, a quarter have a top-bottom reversal only and the remaining quarter have both reversals. That is, the four combinations of the two possible reversals are present in the stack.

Therefore in order to provide the correct directionality for data input and output, the top-bottom reversals are achieved by appropriate addressing of the processors in the array whereas the left-right reversals are achieved by providing two mutually reversed data busses which are respectively connected to alternate column-groups in the stack.

Where the stack contains more than three column-groups it may therefore be convenient to arrange for the two mutually reversed data busses to cross but this crossing of the common-connection busses can be tolerated since the crossings only occur between column-groups and not between adjacent boards (except in the very unusual case where a column only contains one board—in which case it can be regarded as a single-board-row array which is in effect a single column group, requiring only one data bus logic direction). An alternative would be for individual data-bus branches to be provided to the respective column groups.

In order to provide the correct directionality for propagation between processors of the array, e.g. where a signal is to be shifted or scrolled across the array, it is convenient to provide four sets of control signals corresponding to the four combinations of the two possible reversals (only two sets are needed for single-column arrays). Selection of the set of control signals for a particular board may be achieved in various ways and may even be left to the individual processor chips on the board to allow for the possibility that the chips on a board may have several different respective orientations, for reasons of physical construction of the board, for example.

The connectors must also be arranged so that the output connector from one board can be connected to the input connector of the logically adjacent board and vice versa. If the input connections are all on one connector and the outputs on a separate one, as shown in FIG. 14, then this reversal takes place automatically as shown at the bottom of FIG. 14. If, however, a single connector carries signals in both directions, then it will be a side connector with two rows of connections, one above the other, one row being the input and one row being the output connections. If the two connectors are on the corresponding faces of logically adjacent boards and are connected directly by means of a strip cable connector then, of course, the inputs on one board will go to inputs on the other board and outputs to outputs, which is incorrect. A simple solution to this problem is to mount the connector on one of the boards on the opposite face of the board, as shown in FIG. 15. A strip cable running from the top to the bottom board will always connect the top row of connections of each connector to the top row of the other and the bottom row to the bottom row of the other. This has the slight disadvantage that different boards in the array may have the connectors mounted on different sides making the fully assembled boards not identical throughout the array. However, before the connectors are mounted the boards in themselves are identical.

A modification of the stack described above with reference to FIG. 14 involves the possibility of arranging the sets of connectors C1,C2 and C3,C4 for the array-top and array-bottom one behind the other rather than side-by-side as shown in FIG. 14. By arranging that the connectors can be readily mounted on either face of the board it is possible to provide interconnections between C1,C2 of one board and C3,C4 of the next lower board in the stack in one column-group and between C3,C4 of one board and C1,C2 of the next lower board in the stack in the next column group so that the back-front reversal problem can be avoided if desired. There are then only two reversal combinations caused by the need for left-right reversal in alternate column groups.

It will be appreciated that enabling the mounting of connectors on either face of the boards can be extended to all the connectors Cn and that this feature has a variety of uses not necessarily limited to the context of the array processors described here. Identicalness of the boards can be maintained by providing a socket on each face of the board for each connector so that the latter can be mounted on either face.

I claim:

1. A method of producing a data processor array, said method including the steps of forming a plurality of sub-array boards each carrying a plurality of data processors arranged so that each sub-array board comprises a respective sub-array of a larger two-dimensional matrix array of said data processors, forming a stack with said sub-array boards as if each respective sub-array were divided from each adjacent respective sub-array by an imaginery fold line, said sub-array boards being arranged in an order in the stack as if the array were folded along said imaginary fold lines between the sub-arrays, and providing interconnections between the sub-array boards corresponding to interconnections extending across the imaginary fold lines between the sub-arrays in order that none of the interconnections crosses with any other said interconnection.

2. A method according to claim 1 wherein the arrangement of sub-array boards corresponds to the arrangement of sub-arrays as if the folding is concertina-like in one or both of two mutually perpendicular directions of the fold lines between the sub-arrays, neighbouring parallel fold lines providing folds in opposite directions in concertina fashion.

3. A method according to claim 1 wherein the stack is arranged to be vertical with the sub-array boards oriented horizontally.

4. A method according to claim 1 wherein the interconnections are provided at more than one edge of each sub-array board.

5. A data processor array comprising a stack of sub-array boards each carrying a plurality of processors comprising a respective sub-array of a larger two-dimensional matrix array of processors to which the stack logically corresponds, the sub-array boards being arranged in an order in the stack as if each respective sub-array were divided from each adjacent respective sub-array by an imaginary fold line, said sub-array boards being positioned as if the array were folded along said imaginary fold lines, interconnections between the sub-array boards being arranged to correspond to interconnections extending across the imaginary fold lines between the sub-arrays in order that none of the interconnections crosses with any other said interconnection.

6. A data processor array according to claim 5 and produced by a method including the steps of forming a plurality of sub-array boards each carrying a plurality of data processors arranged so that each sub-array board comprises a respective sub-array of a larger two-dimensional matrix array of said data processors, forming a stack with said sub-array boards as if each respective sub-array were divided from each adjacent respective sub-array by an imaginary fold line, said sub-array boards being arranged in an order in the stack as if the array were folded along said imaginary fold lines between the sub-arrays and providing interconnections between the sub-array boards corresponding to interconnections extending across the imaginary fold lines between the sub-arrays in order that none of the interconnections crosses with any other said interconnection wherein the arrangement of sub-array boards corresponds to the arrangement of sub-arrays as if the folding is done in a concertina-like manner in one or both of two mutually perpendicular directions of the imaginary fold lines between the sub-arrays, neighbouring parallel imaginary fold lines providing folds in opposite direction in concertina fashion.

7. An image processing system including a data processor array according to claim 5.

8. A method for stacking two sub-array boards to form a data processor array wherein each of said two sub-array boards have digital data processors, said method comprising the steps of:
(a) dividing a board suitable for use as a sub-array board into two, a top half and a bottom half;
(b) forming a reference line between said top half and said bottom half of said board;
(c) forming two sub-arrays on said board, a first sub-array on said top half of said board and a second sub-array on said bottom half of said board, said first array being a mirror image with respect to orientation of said second array, said mirror image taken along said reference line;
(d) interconnecting said sub-arrays with a strip cable; and
(e) arranging said sub-arrays as if said board were folded along said reference line thereby stacking said two sub-arrays to form a data processor array.

9. A data processor produced by the method of claim 8.

10. A method for stacking eight sub-array boards to form a data processor array wherein each of said sub-array boards have digital data processors, said method comprising the steps of:
(a) dividing a board suitable for use as a sub-array board into eight equally sized blocks, said blocks forming two columns with four blocks in each of said two columns, and four rows with two blocks in each of said four rows;
(b) forming reference lines between each block such that there is one reference line between said two columns and one reference line between each of said four rows;
(c) forming eight sub-arrays, one on each block of said board such that along each of said reference lines the block on one side is a mirror image of the block on the other side with respect to orientation;
(d) interconnecting said sub-arrays with strip cable;
(e) a first step of arranging said sub-arrays as if said board were folded in a concertina-like manner by means of said reference lines between said rows; and
(f) a second step of further arranging said sub-arrays as if said board were folded along the reference line between said columns thereby stacking said eight sub-arrays to form a data processor array.

11. A data processor produced by the method of claim 10.

12. A method for stacking sixteen sub-array boards to form a data processor array wherein each of said sub-array boards have digital data processors, said method comprising the steps of:
(a) dividing a board suitable for use as a sub-array board into sixteen equally sized blocks, said blocks forming four columns with four blocks in each of said four columns and four rows with four blocks in each of said four rows;
(b) forming reference lines between each block such that there is one reference line between each of said four columns and one reference line between each of said four rows;
(c) forming sixteen sub-arrays, one on each block of said board such that along each of said reference lines the block on one side is a mirror image of the block on the other side with respect to orientation;
(d) interconnecting said sub-arrays with strip cables;
(e) a first step of arranging said sub-arrays as if said board were folded in a concertina-like manner by means of said reference lines between said rows; and
(f) a second step of further arranging said sub-arrays as if said board were folded in a concertina-like manner by means of said reference lines between said columns thereby stacking said sixteen sub-arrays to form a data processor array.

13. A data processor produced by the method of claim 12.

* * * * *